United States Patent
Yang et al.

(10) Patent No.: US 6,888,190 B2
(45) Date of Patent: May 3, 2005

(54) EEPROM WITH SOURCE LINE VOLTAGE STABILIZATION MECHANISM

(75) Inventors: Ching-Sung Yang, Hsin-Chu (TW); Shih-Jye Shen, Hsin-Chu (TW); Ching-Hsiang Hsu, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/707,080

(22) Filed: Nov. 20, 2003

(65) Prior Publication Data

US 2004/0099914 A1 May 27, 2004

Related U.S. Application Data

(63) Continuation-in-part of application No. 10/065,591, filed on Oct. 31, 2002, now abandoned.

(51) Int. Cl.[7] .................. H01L 29/76; H01L 29/78; H01L 29/788
(52) U.S. Cl. ................ 257/314; 257/314; 257/315; 257/316; 257/319; 257/320
(58) Field of Search ................. 257/314–320

(56) References Cited

U.S. PATENT DOCUMENTS 6,696,724 B2 * 2/2004 Verhaar .................. 257/314
2003/0198087 A1 * 10/2003 Kinsey et al. .......... 365/185.18
2004/0079988 A1 * 4/2004 Harari ..................... 257/316

* cited by examiner

Primary Examiner—Jerome Jackson
Assistant Examiner—Jesse A. Fenty
(74) Attorney, Agent, or Firm—Winston Hsu

(57) ABSTRACT

A low-voltage nonvolatile memory array includes an N type semiconductor substrate having a memory region. A deep P well is formed in the semiconductor substrate. A cell N well is located within the memory region in the semiconductor substrate. The cell N well is situated above the deep ion well. A shallow P well serving as a buried bit line is doped within the cell ion well. The shallow P well is isolated by an STI layer, wherein the STI layer has a thickness greater than a well depth of the shallow ion well. At least one memory transistor with a stacked gate, a source, and a drain is formed on the shallow ion well. The source of the memory transistor is electrically coupled to the cell N well to induce a capacitor between the cell N well and the deep P well during a read operation, thereby avoiding read current bounce or potential power crash. A bit line overlies the memory transistor and is electrically connected to the drain of the memory transistor via a bit line contact plug short-circuiting the drain of the memory transistor and the shallow P well.

15 Claims, 29 Drawing Sheets

|  | $V_{BL}$ | $V_{WL}$ | $V_{SL}$ | $V_{DPW}$ |
|---|---|---|---|---|
| Program | 5V | -10V | Float | 0V |
| Erase | Float | 10V | -8V | -8V |
| Read | 0V | 0V | 1.5V | 0V |

Fig. 4 (b)

|  | $V_{BL}$ | $V_{WL}$ | $V_{SG}$ | $V_{SL}$ | $V_{DPW}$ |
|---|---|---|---|---|---|
| Program | 5V | -10V | 0V | Float | 0V |
| Erase | Float | 10V | -6V | -8V | -8V |
| Read | 0V | 0V | 5V | 1.5V | 0V |

Fig. 8 (b)

|  | $V_{BL}$ | $V_{WL}$ | $V_{SL}$ | $V_{DPW}$ |
|---|---|---|---|---|
| Program | 5V | -10V | Float | 0V |
| Erase | Float | 10V | -8V | -8V |
| Read | 0V | 4V | 1.5V | 0V |

Fig. 11 (b)

EEPROM WITH SOURCE LINE VOLTAGE STABILIZATION MECHANISM

CROSS REFERENCE TO RELATED APPLICATIONS

This application is a continuation in part of commonly owned, U.S. patent application Ser. No. 10/065,591, "BI-DIRECTIONAL FOWLER-NORDHEIM TUNNELING FLASH MEMORY", by Ching-Sung Yang, Shih-Jye Shen, and Ching-Hsiang Hsu, filed Oct. 31, 2002 now abandoned.

BACKGROUND OF INVENTION

1. Field of the Invention

The present invention relates to a nonvolatile semiconductor memory, and more particularly, to a bi-directional Fowler-Nordheim (FN) write/erase flash memory utilizing a compatible and low-electric consumption operation mode. An induced capacitor is created between a cell N well and an underlying deep P well to help stabilize source line voltage during read operations. According to the present invention, high-speed code flash memory and high-density data flash memory can be integrated on a single chip.

2. Description of the Prior Art

Recently, flash electrically erasable programmable read-only memories (EEPROMs) have gained substantial interest as the best solution for electrically rewritable nonvolatile data storage. These semiconductor memories, which have been broadly used on digital products such as digital cameras, cell phones, video game apparatuses, personal digital assistants (PDA), and so on, combine the high integration density and the high programming speed of EPROMs with the higher functionality of EEPROMs by offering electrical in-circuit erasability. In general, flash memories are categorized into NOR cell and NAND cell types. As known in the art, NOR type flash memory can be operated at higher read speeds and is thus suited for code flash, which primarily implements program transformation. NAND type flash memory has a relatively low read speed but higher density so that it is typically used as data flash, which primarily implements data access or data storage.

Please refer to FIG. 1. FIG. 1 is a cross-sectional view illustrating a conventional NAND type EEPROM 10. As shown in FIG. 1, the NAND type EEPROM 10 comprises an N-type semiconductor substrate 12, a P-type semiconductor well 14 located in the semiconductor substrate 12, a plurality of NAND cell blocks ($B_1$, $B_2$~$B_N$) in one column located on the P-type semiconductor well 14, and a local bit line BL1 located over the column of NAND cell blocks ($B_1$, $B_2$~$B_N$). The prior art NAND type EEPROM 10 further comprises another column of NAND cell blocks (not shown) next to the column of NAND cell blocks ($B_1$, $B_2B_N$) of FIG. 1, and both columns of NAND cell blocks are formed on the same (commonly used) P-type semiconductor well 14 having a well depth that is deeper than the depth of STI regions. Each of the NAND cell blocks ($B_1$, $B_2B_N$) comprises a plurality of rewritable NMOS memory transistors ($M_0$~$M_N$) connected in series along a direction of the local bit line BL1. The rewritable NMOS memory transistors ($M_0$~$M_n$) are a stacked gate structure, as known in the art, each having an upper control gate 20 and a lower floating gate 22 for storing charges. Rows of word lines are connected to the control gates 20 of memory transistors ($M_0$~$M_n$). At two opposite ends of each of the NAND cell blocks ($B_1$, $B_2$~$B_N$) are provided a bit line selection transistor SGB and a source line selection transistor SGS, respectively, where one terminal of the bit line selection transistor SGB is electrically connected to the local bit line BL1, and one terminal of the source line selection transistor SGS is electrically connected to a source line SL.

However, the above-mentioned flash memory architecture has a drawback in that it consumes a great deal of electricity during a data program operation, leading to a decreased duration of batteries used in digital products. When implementing a data program operation regarding the prior art NAND type EEPROM 10, by way of example, a high voltage such as 20V is applied on a selected word line, and a high voltage such as 12V is applied to unselected word lines to conduct N channels thereof. Consequently, the prior art NAND type EEPROM 10 has very high power consumption. Furthermore, since high voltages, for example, 20V (for the selected cell) and 12V (for non-selected cells), are required to be applied on the selected and un-selected word lines, the programming speed is decelerated, and corresponding reliability problems such as junction breakdown or over-erase will occur. Moreover, since the operation mode of the prior art NAND flash is different from the operation mode of conventional NOR flash, it is difficult to integrate both types of memories onto a single chip. This is because NAND-type data flash memory utilizes a Fowler-Nordheim (FN) tunneling mechanism to implement data programming, while the NOR-type code flash utilizes a hot-carrier injection mechanism to implement data programming. In addition, the prior art flash memory occupies more chip area, thus more costly.

SUMMARY OF INVENTION

Accordingly, it is the primary objective of the claimed invention to provide a low-energy consumption nonvolatile memory, which is operated at relatively low voltages, thereby prolonging duration of batteries of portable electric apparatuses.

It is another objective of the claimed invention to provide an electrically erasable programmable read-only memory (EEPROM) that occupies smaller chip area and can be operated by using a reliable operation mode without the fear of over-erasing.

It is still another objective of the claimed invention to provide an EEPROM capable of integrating high-density NAND flash memory and low-density/high-speed NOR flash memory on a single chip.

It is still another objective of the claimed invention to provide an EEPROM comprising a unique isolated buried local bit line and capable of implementing bi-directional FN write/erase operations.

It is yet another objective of the claimed invention to provide an integrated single chip combining BiAND-type EEPROM with 2T-BiNOR EEPROM and having compatible operation (erase/write/read) modes.

In accordance with the above objectives, the claimed invention is addressed to a specific low-voltage nonvolatile memory array comprising: a substrate, a cell well of a first conductivity type formed in the substrate, and columns of buried bit lines of a second conductivity type formed within the cell well. The columns of the buried bit lines are isolated from each other and each of which is further divided into plurality of sub-bit line segments with deeply doped source wells of the first conductivity type connected to the cell well. A plurality of memory cell blocks are serially arranged over one of the columns of buried bit lines, wherein a memory cell block corresponds to a sub-bit line segment, and each of the memory cell blocks comprises at least one memory transistor having a stacked gate, a source, and a drain. A local bit line over-lies the memory cell blocks and is electrically connected to the drain of the memory transistor via a contact plug short-circuiting the drain and the subjacent buried bit line thereof.

In accordance with one feature of the claimed invention, a nonvolatile memory device comprises: a substrate, a cell well of a first conductivity type formed in the substrate, columns of buried bit lines of second conductivity type formed within the cell well. The columns of the buried bit lines are isolated from each other and each of which is further divided into plurality of sub-bit line segments with deeply doped source wells of the first conductivity type connected to the cell well of first conductivity type. A plurality of memory cell blocks are serially arranged over one of the columns of buried bit lines, wherein a memory cell block corresponds to a sub-bit line segment, and each of the memory cell blocks comprises at least one memory transistor having a control gate, a floating gate, a source, and a drain. The nonvolatile memory device of this invention further comprises rows of word lines, each of which connects to the control gate of one of the memory transistors. A local bit line overlies the memory cell blocks and electrically connected to the drain of the memory transistor via a contact plug short-circuiting the drain and the subjacent buried bit line. The nonvolatile memory device of this invention further comprises columns of main bit lines. The columns of the buried bit lines are isolated from each other with shallow trench isolations.

According to one preferred embodiment of the claimed invention, the deeply doped source well of first conductivity type serves as the source of the memory transistor. The source line is electrically coupled to the cell N well to avoid large read current bounce or potential power crash during read operations. According to another preferred embodiment of the claimed invention, the memory cell block further comprises a selection transistor having one end serially connected to the source of the memory transistor and the deeply doped source well serves as a source of the selection transistor. According to yet another embodiment of the claimed invention, each of the memory cell blocks comprises a plurality of memory transistors serially connected to each other to form a NAND memory cell array.

Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 2(*b*) is an enlarged top view of the memory layout EEPROM of FIG. 2(*a*);

FIG. 2(*c*) is a cross-sectional view along line AA" of FIG. 2(*b*);

FIG. 3(*b*) is a corresponding equivalent circuit of FIG. 3(*a*);

FIG. 4(*b*) is a table listing, by way of example, all operation parameters when operating the selected memory cell in FIG. 4(*a*);

DETAILED DESCRIPTION

Figure 1:
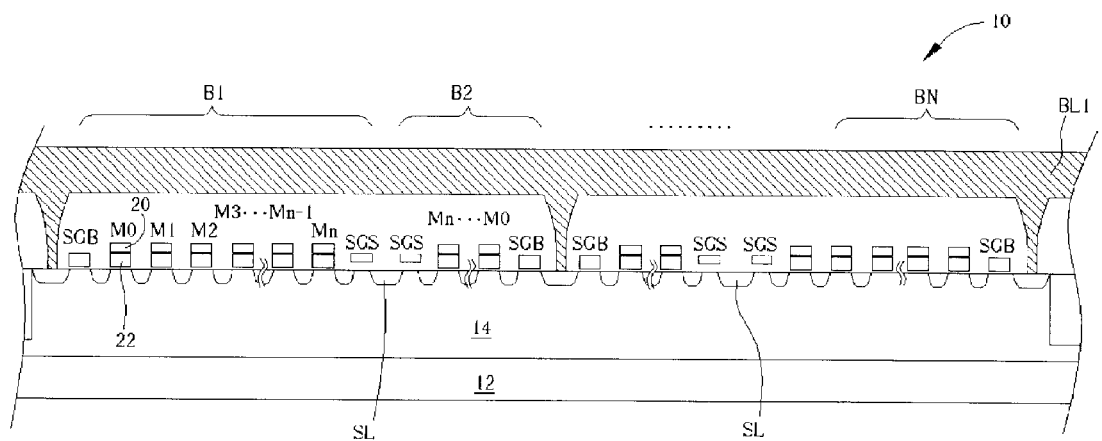
FIG. 1 is a cross-sectional view illustrating a conventional NAND type EEPROM.
Figure 2:
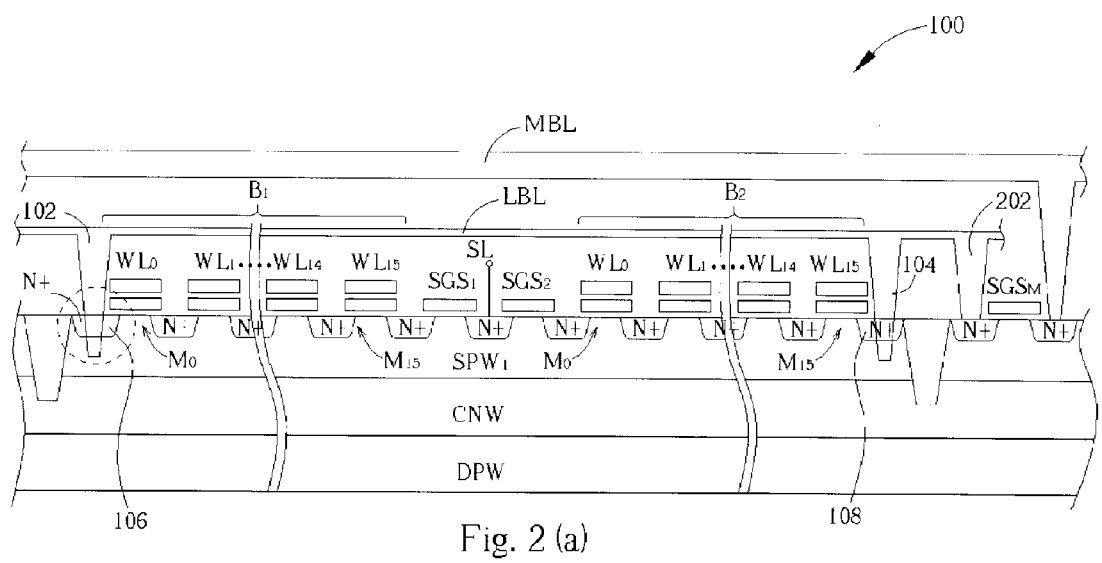
FIG. 2(*a*) is a cross-sectional schematic diagram showing a portion of an EEPROM according to the first preferred embodiment of this invention.
Figure 2:
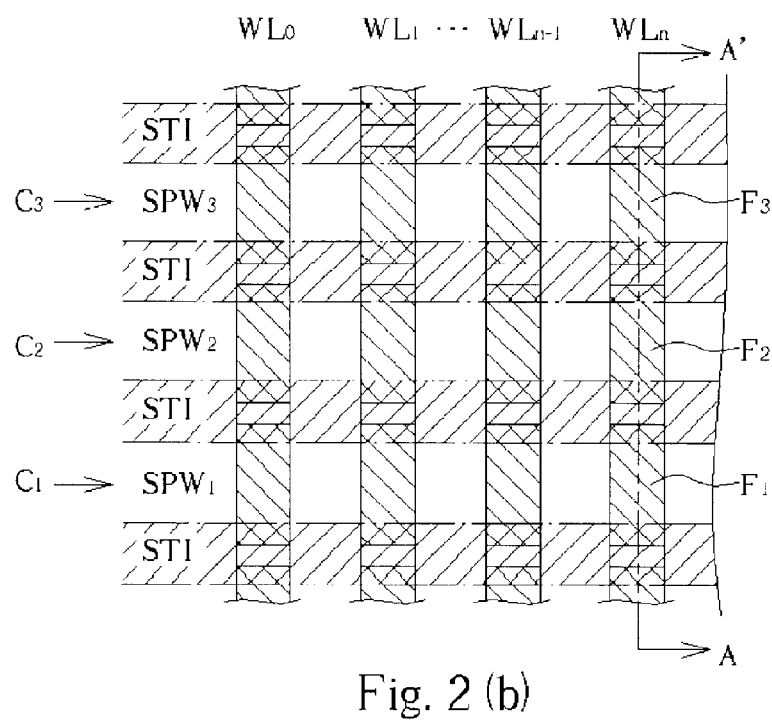
Figure 2:
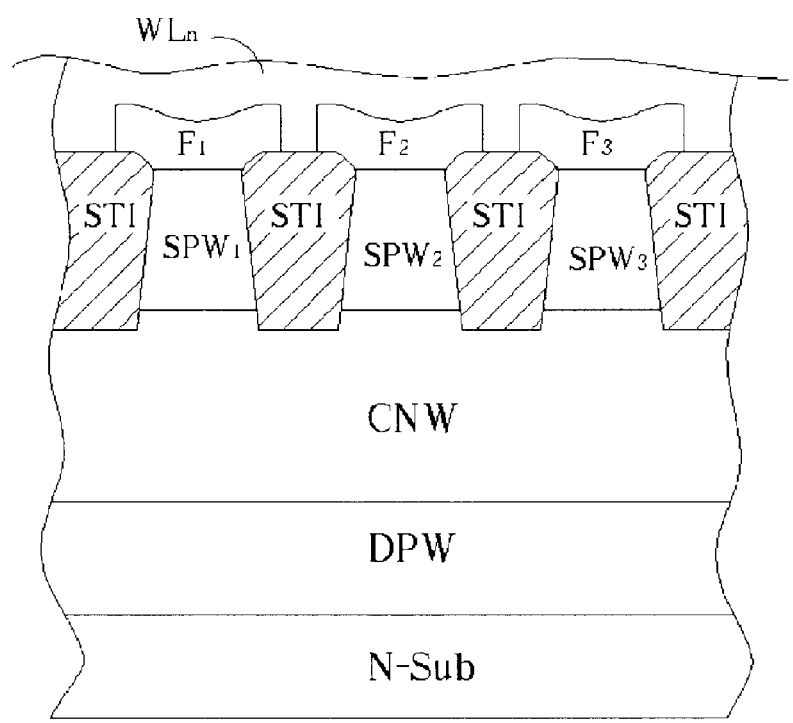

Referring to FIG. 2(*a*), a portion of an EEPROM 100 is shown in a cross-sectional view according to the first preferred embodiment of this invention in which only two series connected NAND memory cell blocks B1 and B2 are illustrated for the sake of simplicity. As shown in FIG. 2(*a*), the EEPROM 100, which is based on a novel low-voltage bi-directional FN write/erase NAND type flash memory array architecture, comprises a deep P-well (hereinafter referred to as "DPW"), a cell N-well (hereinafter referred to as "CNW"), a plurality of columns of shallow P-wells (hereinafter referred to as "SPW"). Each of the plural columns of shallow P-wells, which serve as a buried local bit line during operations, is isolated from each other with shallow trench isolation (STI) regions, which are not explicitly denoted in FIG. 2(a). To isolate the shallow P-wells from each other, the thickness of the STI layer is greater than the well depth of the shallow P-wells. It is understood that only one of columns of parallel shallow P-wells is illustrated, that is, $SPW_1$, on which a plurality of NAND cell blocks series connected in one column are formed, as specifically indicated in FIG. 2(a). A local bit line (hereinafter referred to as "LBL") ovelies the column of NAND cell blocks. It is understood that between the B1 and B2 cell blocks, it is also possible to insert (n−2) additional memory cell blocks, where in a practical case, by way of example, n=16.

Still referring to FIG. 2(a), each of the NAND memory cell blocks B1 and $B_2$ comprises a plurality of floating gate memory cells ($M_0$~$M_{15}$) connected in series manner. That is to say, according to the first preferred embodiment of the present invention, there are sixteen memory transistors or memory cells ($M_0$~$M_{15}$) for each of the NAND memory cell blocks $B_1$ and $B_2$. Each of the memory cells ($M_0$~$M_{15}$) has a stacked gate structure, i.e., upper word lines ($WL_0$~$WL_{15}$) and floating gates. Since this invention does not specifically emphasize the structure of the memory cell units, detailed discussion on it will therefore be omitted. A source line selection transistor (SGS1) is disposed at one end of the NAND cell block $B_1$. The SGS1 has one terminal electrically connected to the source of the NMOS memory transistor $M_{15}$ of the NAND cell block $B_1$ and another terminal electrically connected to a source line (SL) for controlling read signals. At the other end of the NAND cell block $B_1$, a contact plug 102 is electrically connected with a drain 106 of the NMOS memory transistor $M_0$ of the NAND cell block $B_1$. As specifically indicated in the circle region of FIG. 2(a), the contact plug 102 penetrates a junction of the drain 106 and the underlying buried bit line $SPW_1$, thereby short-circuiting the drain 106 and the subjacent buried bit line $SPW_1$. The contact plug 102 is electrically connected to an overlying local bit line (LBL). Via a contact plug 202, LBL is electrically connected to one terminal of a main bit line selection transistor ($SGB_M$), which serves as a switch for controlling signals transferred from a main bit line (MBL) to the LBL. Likewise, a source line selection transistor (SGS2) is disposed at one end of the NAND cell block $B_2$. The SGS2 has one terminal electrically connected to the source of the NMOS memory transistor $M_0$ of the NAND cell block $B_2$ and another terminal electrically connected to the source line (SL). At the other end of the NAND cell block $B_2$, a contact plug 104 is electrically connected with a drain 108 of the NMOS memory transistor $M_{15}$ of the NAND cell block $B_2$. The contact plug 104 penetrates ajunction of the drain 108 and the underlying buried bit line $SPW_1$, thereby short-circuiting the drain 108 of the memory transistor $M_{15}$ and the subjacent buried bit line $SPW_1$.

Please refer to FIG. 2(b) and FIG. 2(c), where FIG. 2(b) is an enlarged top view of the memory layout EEPROM 100 of FIG. 2(a) and FIG. 2(c) is a cross-sectional view along line AA" of FIG. 2(b). As mentioned, the EEPROM 100 of the present invention comprises a plurality of columns of serially connected NAND cell blocks ($C_1$, $C_2$, $C_3$) and each column of cell blocks is formed on an associated SPW ($SPW_1$, $SPW_2$, $SPW_3$) which is isolated with STI regions. As most clearly shown in FIG. 2(c), each of the memory cells of one NAND cell block has a stacked gate structure, i.e., upper word lines ($WL_n$) and floating gates ($F_1$, $F_2$, $F_3$). According to one embodiment of this invention, the DPW is formed over an N-type semiconductor substrate.

While the above-described BiAND EEPROM memory structure according to the first preferred embodiments of the present invention has many advantages such as, among other things, low-voltage operations, high-density packing, and over-erase free, it is not perfect. For example, when implementing a page mode read operation on a 4 k bit lines array, each bit line may conduct a 5 μA current, and that makes a Total Required Current to 4 k×5. A=0 mA. Such large read current bounce during the read operation may lead to a fluctuating read voltage or even power crash in a worse case. To overcome such potential problems during read operations, other preferred Bi-directional FN write/erase flash memory structures are proposed in this application with reference to FIG. 3 to FIG. 15.

Figure 3:
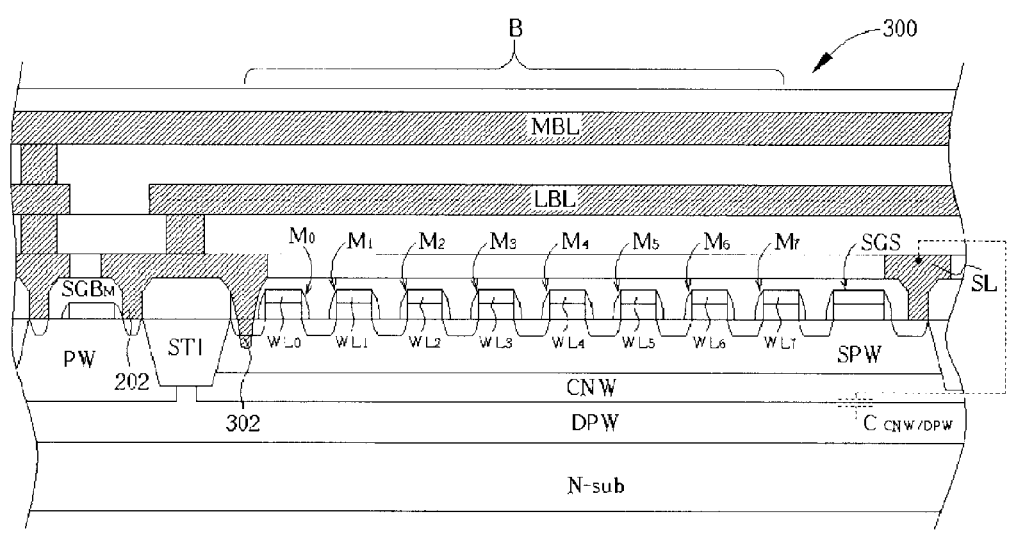
FIG. 3(*a*) is a cross-sectional schematic diagram showing an EEPROM according to the second preferred embodiment of the present invention.
Figure 3B:
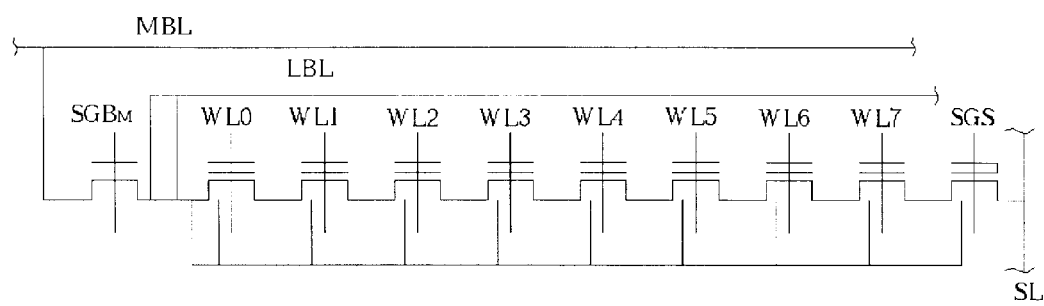
Figure 4:
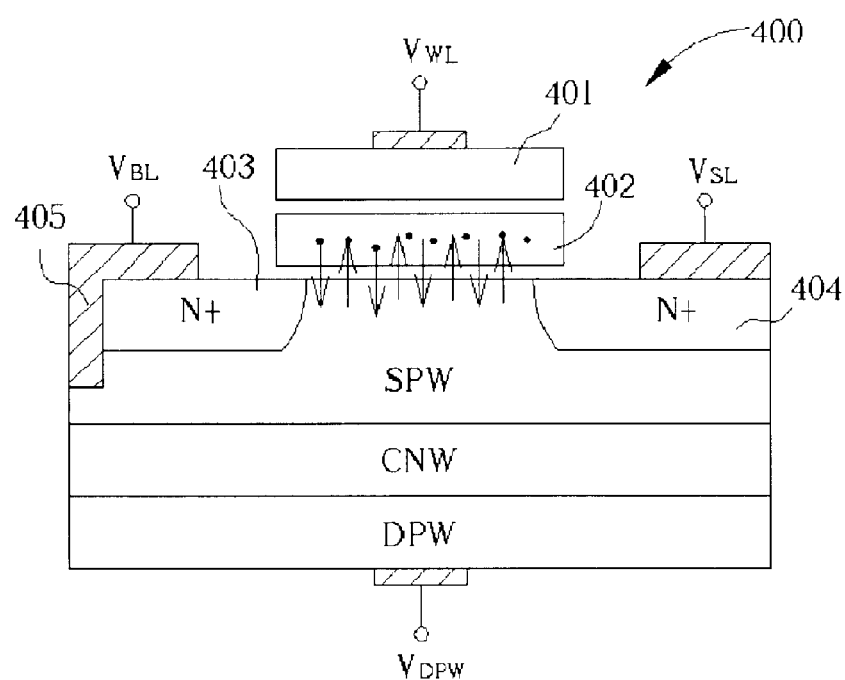
FIG. 4(*a*) is a cross-sectional schematic diagram illustrating a selected memory cell among a NAND cell block according to this invention.

Referring to FIG. 3(a) and FIG. 3(b), an EEPROM 300 in a cross-sectional view and corresponding equivalent circuit according to the second preferred embodiment of the present invention are illustrated. As shown in FIG. 3(a), the EEPROM 300, which is also based on a novel low-voltage bi-directional FN write/erase NAND (BiAND) type flash memory array architecture, comprises a DPW formed on an N-substrate, a CNW formed on the DPW, columns of isolated SPW formed within the CNW, a NAND memory cell block B formed on the SPW, and a local bit line LBL overlying the NAND memory cell block B. The NAND memory cell block B comprises a plurality of serially connected floating gate memory cells ($M_0$~$M_7$). That is to say, according to the second preferred embodiment of the present invention, there are eight memory transistors or memory cells ($M_0$~$M_7$) for the NAND memory cell block B. Each of the memory cells ($M_0$~$M_7$) has a stacked gate structure, i.e., upper word lines ($WL_0$~$WL_7$) and floating gates. A source line selection transistor (SGS) is disposed at one end of the NAND cell block B. The SGS has a stacked gate structure similar to the memory cells, but the control gate and the floating gate of the SGS are electrically connected. The SGS has one terminal electrically connected to the source of the NMOS memory transistor M of the NAND cell block B and another terminal electrically connected to a source line (SL) for controlling read signals. As specifically indicated with dash line, it is one of the main features of the present invention that the source line (SL) is electrically coupled to the deep P well (DPW) through the interconnection and a conductive pick up device (not shown) in accordance with one preferred embodiment of the present invention. When a read voltage, say 1.5V, is applied on the source line, a induced capacitor $C_{CNW/DPW}$ is created at the junction between the CNW and DPW, thereby stabilizing source line voltage.

At the other end of the NAND cell block B, a contact plug 302 is electrically connected with a drain of the NMOS memory transistor $M_0$ of the NAND cell block B. The contact plug 302 penetrates ajunction of the drain and the underlying SPW, thereby short-circuiting the drain of the memory cell $M_0$ and the subjacent SPW. The contact plug 302 is electrically connected to the overlying LBL. Via a contact plug 202, LBL is electrically connected to one terminal of a main bit line selection transistor ($SGB_M$), which serves as a switch for controlling signals transferred from a main bit line (MBL) to the LBL.

As shown in FIG. 3(b), the control gate of the SGS is electrically connected to the floating gate thereof. The $SGB_M$ controls main bit line (MBL) signals and the SGS controls source line (SL) signals. With such configuration, the EEPROM 300 is capable of implementing unique low-voltage FN write/erase operations by virtue of the use of buried local bit lines (isolated SPW).

Referring to FIG. 4(a) and FIG. 4(b), where FIG. 4(a) is a cross-sectional schematic diagram illustrating a selected memory cell among a NAND cell block according to this invention and FIG. 4(b) is a table listing, by way of example, all operation parameters when operating the selected memory cell in FIG. 4(a). As mentioned, according to the present invention, the NAND memory cells are formed on an isolated SPW, which serves as a buried bit line. The LBL is electrically connected to the SPW through a contact plug that penetrates into the substrate. Such memory structure, which is named as BiAND-EEPROM by the inventors, is capable of implementing desirable low-voltage FN tunneling write/erase operations. As shown in FIG. 4(a), in operation, a word line voltage $V_{WL}$ is applied to the control gate 401 of the memory cell 400, a bit line voltage $V_{BL}$ is applied to the drain 403, a source line voltage $V_{SL}$ is applied to source 404, and a well voltage $V_{DPW}$ is applied to DPW. Since the SPW and the drain 403 are short-circuited together, the voltage of the SPW and the voltage of the drain 403 are the same. The floating gate 402 is floating. As shown in FIG. 4(b), during an erase operation, $V_{BL}$ is floating, $V_{WL}$=10V, $V_{SL}$=−8V, $V_{DPW}$=−8V. Under this condition, electrons are injected into and trapped in the floating gate 402 by FN tunneling through an oxide layer between the floating gate 402 and the SPW, thereby adjusting the memory cell 400 to a higher threshold voltage (higher $V_{TH}$) state, for example, in a range like 1.5V<$V_{TH}$<3.5V. When implementing a write or program operation, $V_{BL}$=5V, $V_{WL}$=−10V $V_{SL}$ is floating, $V_{DPW}$=0V. Under this condition, trapped electrons in the floating gate 402 are repelled out by FN tunneling, thereby adjusting the memory cell 400 to a lower threshold voltage (lower $V_{TH}$) state, for example, in a range like $V_{TH}$<−1V. When implementing a read operation, $V_{BL}$=0V, $V_{WL}$=0V, $V_{SL}$=1.5V, $V_{DPW}$=0V.

Figure 5:
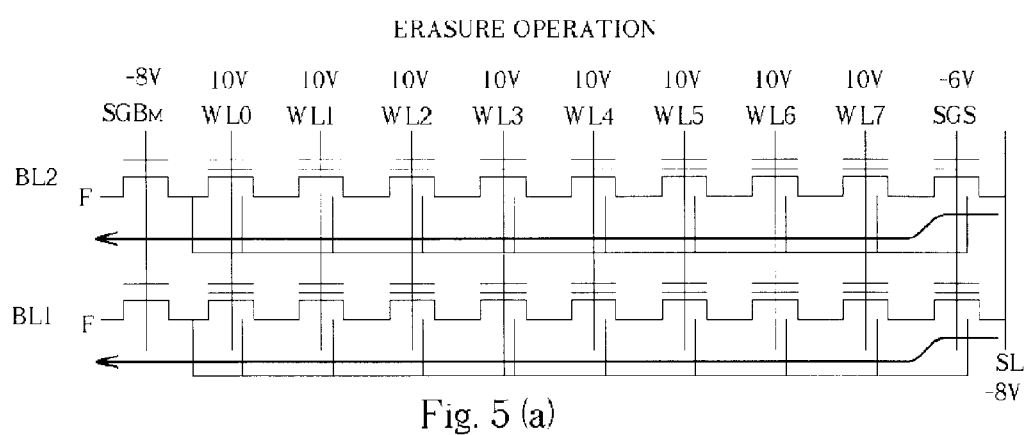
FIG. 5(*a*) to FIG. 5(*c*) are a segmental circuit arrangement of the BIAND-EEPROM and exemplary operation modes thereof (erase, program, and read operations, respectively) according to the first preferred embodiment of this invention.
Figure 5:
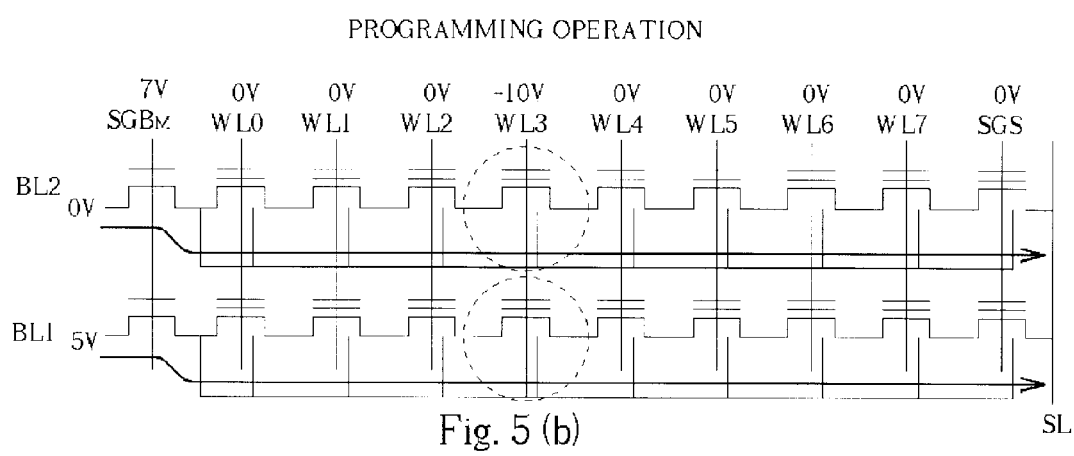
Figure 5C:
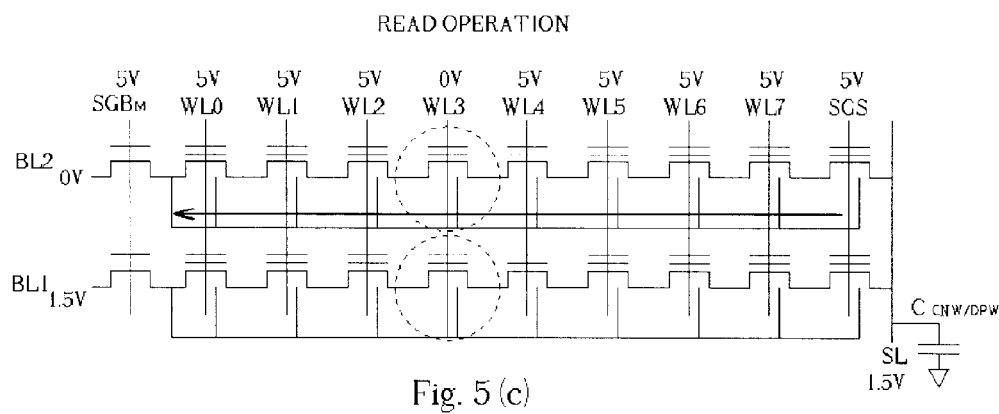

Referring to FIG. 5(a) to FIG. 5(c), a segmental circuit arrangement of the BiAND-EEPROM and exemplary operation modes thereof (erase, program, and read operations, respectively) are shown according to the first preferred embodiment of this invention. As shown in FIG. 5(a), during an erase operation, all of the word lines $WL_0$~$WL_7$ are applied with a word line voltage of 10V, and $V_{PDW}$=−8V. All of the bit lines (only $BL_1$ and $BL_2$ are shown) are floating. Source lines (SL) are applied with a source line voltage of 8V. A gate voltage of 6V is applied to the control gate of the source line selection transistor SGS. Under this condition, electrons are injected into the floating gates of all of the flash memory cells through a so-called FN tunneling mechanism so as to adjust the threshold voltage ($V_{TH}$) of each of the memory cells to a relatively high $V_{TH}$ state, preferably, in a range of 1.5V<$V_{TH}$<3.5V.

As shown in FIG. 5(b), during a data program or data write operation, a word line voltage of 10V is applied to the control gate of a selected word line $WL_3$, by way of example. A word line voltage of 0V is applied to the non-selected word lines, i.e., $WL_0$~$WL_2$ and $WL_4$~$WL_7$ within the NAND cell block, and $V_{PDW}$=0V. A bit line voltage of 5V is applied to a selected bit line $BL_1$. Non-selected bit lines (only one non-selected bit line $BL_2$ is shown) are grounded. The source line (SL) is kept in a floating status. A gate voltage of 7V is applied to the control gate of the bit line selection transistor SGB. A gate voltage of 0V is applied to the control gate of the source line selection transistor SGS. Under this condition, electrons are repelled out of the floating gate of the selected flash memory cell through the FN tunneling mechanism so as to adjust the threshold voltage ($V_{TH}$) of each of the memory cells to a relatively low $V_{TH}$ state, preferably, $V_{TH}$<−1V.

As shown in FIG. 5(c), during a data read operation, a word line voltage of 0V is applied to the control gate of a selected word line $WL_3$, by way of example. A word line voltage of 5V is applied to those non-selected word lines, i.e., $WL_0$~$WL_2$ and $WL_4$~$WL_7$ within the NAND cell block so as to conduct channels thereof. A source line voltage of 1.5V is applied to the source lines (SL). A bit line voltage of 0V is applied to a selected bit line $BL_2$. A bit line voltage of 1.5V is applied to those non-selected bit lines (only one non-selected bit line ($BL_1$) is shown). A gate voltage of 5V is applied to the control gate of the bit line selection transistor SGB. A gate voltage of 5V is applied to the control gate of the source line selection transistor SGS. As aforementioned, since the source line (SL) is electrically coupled to the cell N well (CNW), an induced capacitor $C_{CNW/DPW}$ is generated at the CNW(1.5V)/DPW(ground) junction for stabilizing source line voltage.

Figure 6:
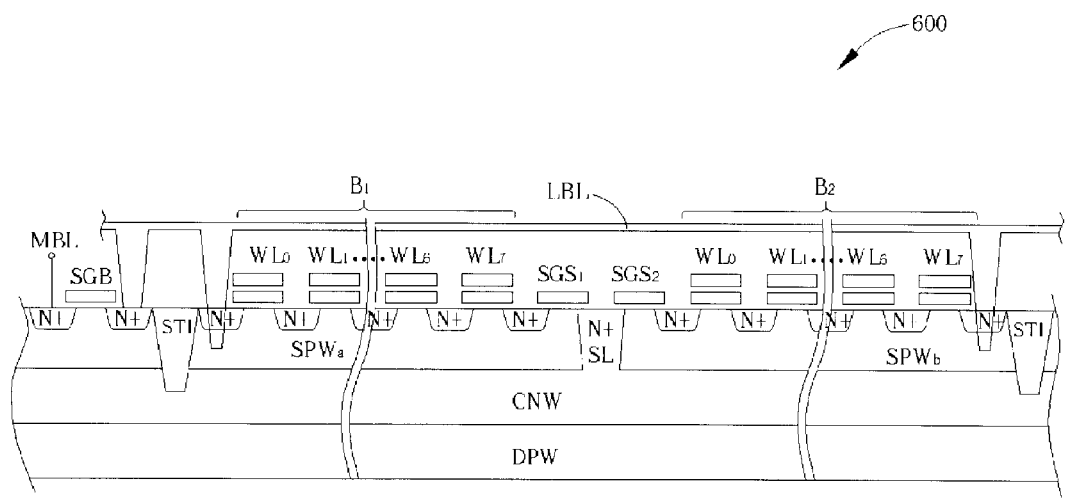
FIG. 6 depicts a portion of a low-voltage bi-directional FN write/erase EEPROM in a cross-sectional view according to the third preferred embodiment of this invention in which only two serially connected NAND memory cell blocks B and $B_2$ are illustrated.

Referring to FIG. 6, a portion of a low-voltage bi-directional FN write/erase EEPROM 600 is shown in a cross-sectional view according to the third preferred embodiment of this invention in which only two serially connected NAND memory cell blocks $B_1$ and $B_2$ are illustrated for the sake of simplicity. As shown in FIG. 6, the EEPROM 600 comprises a DPW, a CNW, a plurality of columns of SPWs. Each of the plural columns of SPWs, which serve as a buried local bit line during operations, is isolated from each other with STI regions. The thickness of the STI layer is greater than the well depth of the shallow P-wells. A plurality of NAND cell blocks serially connected in one column are provided. A LBL overlies the column of NAND cell blocks. Each NAND memory cell block $B_1$ and $B_2$ comprises a plurality of floating gate memory cells ($M_0$~$M_7$) connected in series manner. Likewise, each of the memory cells ($M_0$~$M_7$) has a stacked gate structure, i.e., upper word lines ($WL_0$~$WL_7$) and floating gates. A source line selection transistor (SGS1) is disposed at one end of the NAND cell block $B_1$. The SGS1 has one terminal electrically connected to the source of the NMOS memory transistor $M_7$ of the NAND cell block $B_1$ and another terminal electrically connected to a source line (SL) for controlling read signals. The source line is an $N^+$ deep doping region ($N^+SL$) and is contiguous with the underlying CNW, thereby dividing the column of SPW into sub-wells (or sub-buried local bit lines): $SPW_a$ and $SPW_a$ corresponding to the NAND cell block $B_1$ and NAND cell block $B_2$ respectively. At the other end of the NAND cell block $B_1$, a contact plug is electrically connected with a drain of the NMOS memory transistor $M_0$ of the NAND cell block $B_1$. The contact plug penetrates a junction of the drain and the underlying sub-local buried bit line $SPW_a$, thereby short-circuiting the drain and the subjacent buried bit line $SPW_a$. The contact plug electrically connected to an overlying local bit line (LBL).

Figure 7:
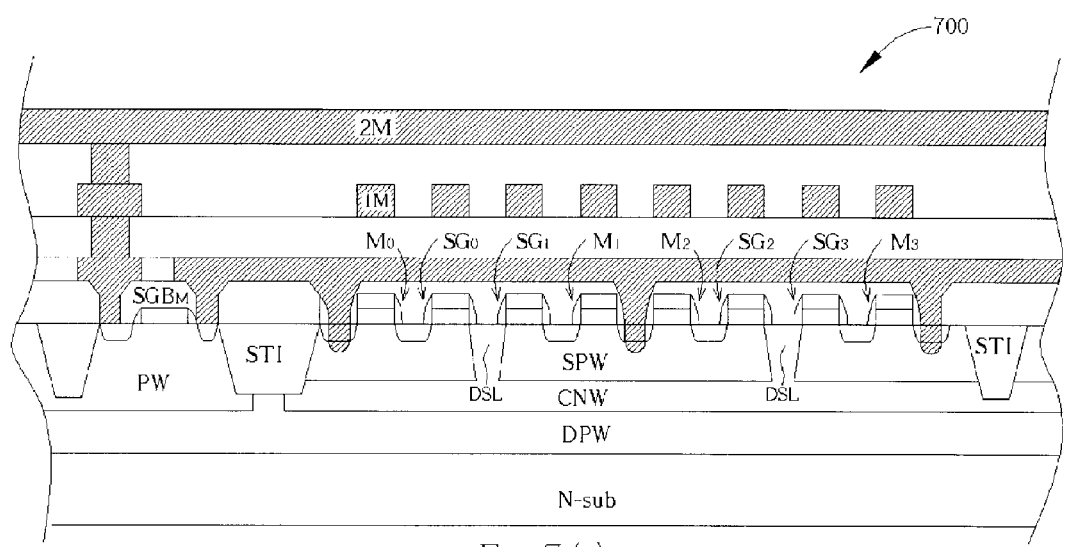
FIG. 7(*a*) and FIG. 7(*b*) are shown in a cross-sectional view showing a portion of an EEPROM, and a circuit arrangement of FIG. 7(*a*) according to the fourth preferred embodiment of this invention.
Figure 7:
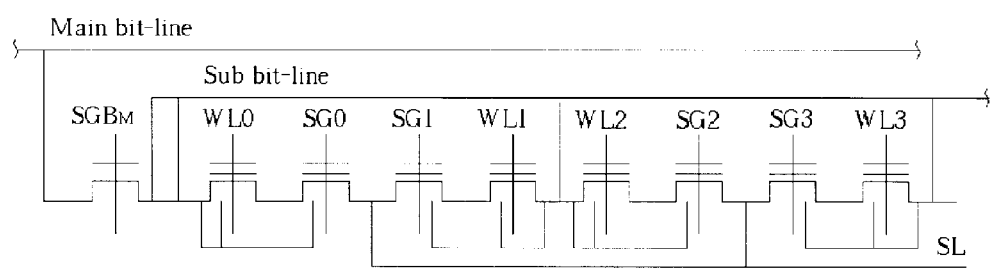
Figure 8:
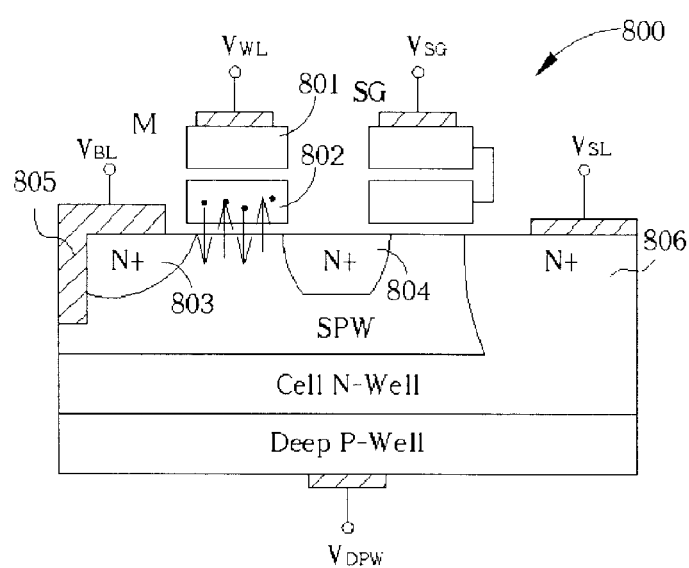
FIG. 8(*a*) and FIG. 8(*b*) is a cross-sectional schematic diagram illustrating a 2T-BiNOR EEPROM unit and exemplary operation modes thereof (erase, program, and read operations, respectively) according to the fourth preferred embodiment of this invention.
Figure 9:
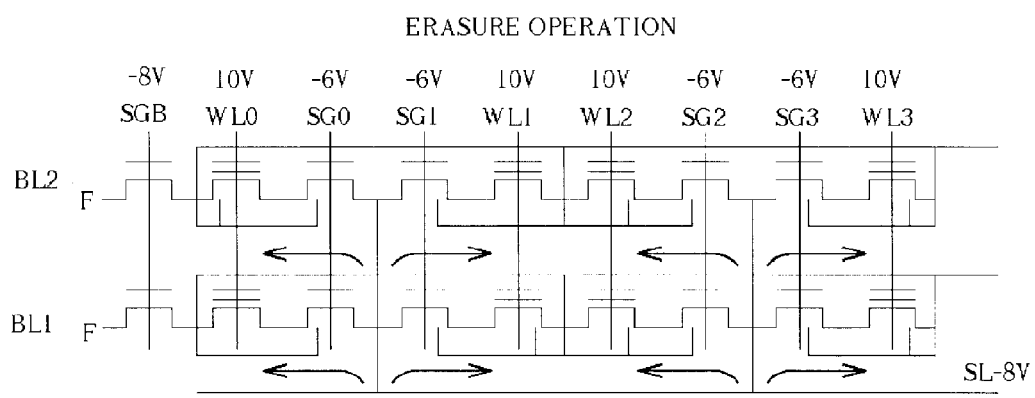
FIG. 9(*a*) to FIG. 9(*c*) are a segmental circuit arrangement of the 2T-BiNOR-EEPROM and exemplary operation modes thereof (erase, program, and read operations, respectively) according to the fourth preferred embodiment of this invention.
Figure 9:
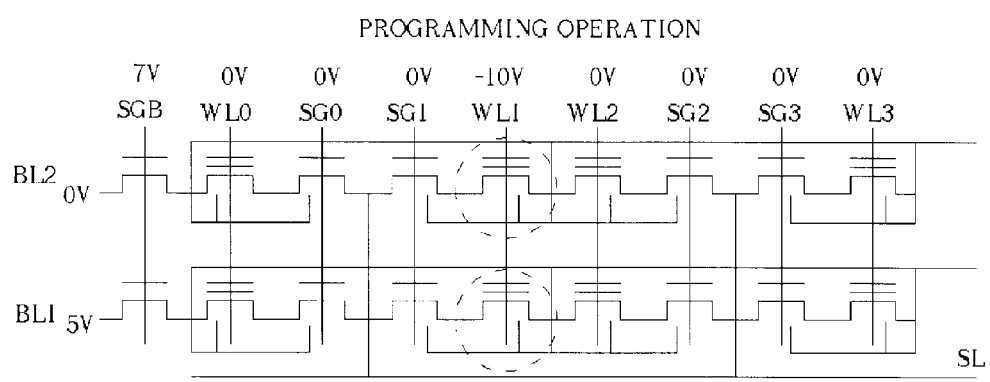
Figure 9:
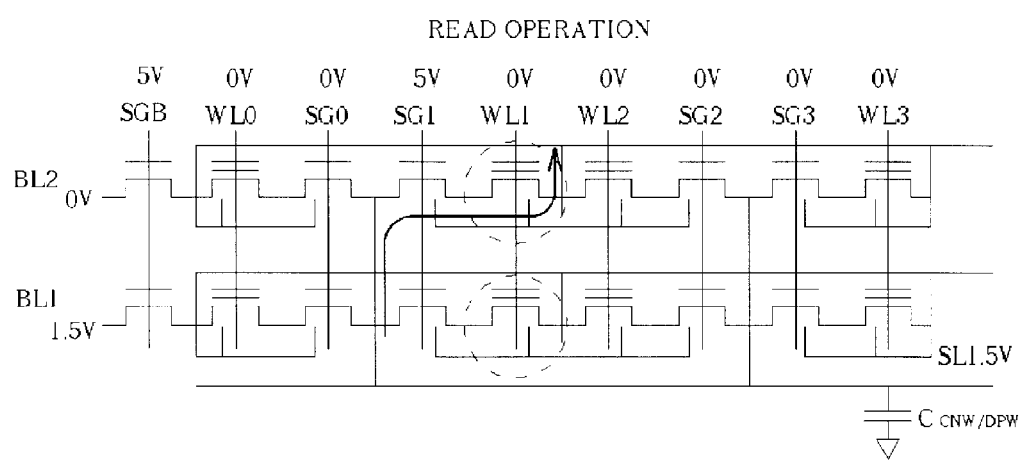

Referring to FIG. 7(a) and FIG. 7(b), a cross-sectional view a portion of an EEPROM 700 and a circuit arrangement of FIG. 7(a) are respectively shown according to the fourth preferred embodiment of this invention. As shown in FIG. 7 (a), the EEPROM 700, which is based on a novel low-voltage bi-directional FN write/erase two-transistor NOR (2T-BiNOR) type flash memory array architecture, comprises a DPW, a CNW, a plurality of columns of shallow P-wells (SPW), a plurality of 2T memory units arranged in series on the SPW, and an LBL overlying the column of 2T memory units. Each of the plural columns of SPWs, which serve as a buried local bit line during operations, is isolated from each other with the STI regions. The thickness of the STI layer is greater than the well depth of the shallow P-wells. Each 2T memory unit comprises a memory transistor M (only $M_0$~$M_3$ are shown) and a selection transistor SG (only $SG_0$~$SG_3$ are shown). In this embodiment, the memory transistor M and the selection transistor SG have a similar stacked gate structure including a word line and a floating gate. It is noted that the word line and floating gate of the selection transistor sustain same voltage level during operation by electrically connecting the word line with the floating gate. The source of the memory transistor M is electrically connected to one terminal of the selection transistor SG. The drain of the memory transistor M is penetrated by a contact plug, as specifically indicated in this figure, which extends downward to the SPW, thereby short-circuiting the drain of the memory transistor M and the SPW. The source of the selection transistor SG is preferably an $N^+$ deep doping region or deep source line (DSL), which is contiguous with the subjacent CNW. Each isolated SPW is further divided into separate sub-SPW segments by the DSL. As shown in FIG. 7 (b), a main bit line selection transistor $SGB_M$ is disposed between the main bit line and the local bit line on a P-well (PW) and is used to control signals from the main bit line to the local bit line. The selection transistor SG of the memory unit is used to control signals from the source lines (DSL). With such configuration, the EEPROM 700 of this invention is capable of implementing unique lowvoltage and random access FN write/erase operations.

Referring to FIG. 8(a) and FIG. 8(b), a cross-sectional schematic diagram illustrating a 2T-BiNOR EEPROM unit 800 and exemplary operation modes thereof (erase, program, and read operations, respectively) are shown according to the fourth preferred embodiment of this invention. As mentioned, the 2T-NOR EEPROM unit 800 is fabricated on an isolated column of SPW that serves as a buried bit line. The LBL is electrically connected to the SPW through a contact plug that penetrates the junction between the drain of the memory transistor M and the SPW. As shown in FIG. 8(a), in operation, a word line voltage $V_{WL}$ is applied to the control gate 801 of the memory transistor M, a bit line voltage $V_{BL\ is\ applied\ to\ the\ N+}$ drain 803. Since the SPW and the drain 803 are short-circuited together by using a plug 805, the voltage of the SPW and the voltage of the drain 803 are the same. The $N^+$ source 804 of the memory transistor M is serially connected to the selection transistor SG. The floating gate 802 of the memory transistor M is kept in a floating status. The control gate and floating gate of the selection transistor SG sustain same voltage level during operation by electrically connecting the word line with the floating gate. A gate voltage $V_{SG}$ is applied to the control gate of the selection transistor SG. A source line voltage $V_{SL\ is\ applied\ to\ the\ N+}$ source 806 of the selection transistor SG, which is an $N^+$ deep source line (DSL) and is contiguous with the subjacent cell N-well. A well voltage $V_{DPW}$ is applied to the DPW.

As shown in FIG. 8(b), during an erase operation, $V_{BL}$ is floating, $V_{WL}$=10V, $V_{SL}$=−8V, $V_{SG}$=−6V, $V_{DPW}$=−8V. Under this condition, electrons are injected into and trapped in the floating gate 802 by FN tunneling through an oxide layer between the floating gate 802 and the SPW, thereby adjusting the memory cell 800 to a higher threshold voltage (higher VTH) state, for example, in a range like 1.5V<$V_{TH}$<3.5V. When implementing a program operation, $V_{BL}$=5V, $V_{WL}$=−10V, $V_{SL}$ is floating, $V_{DPW}$=0V, $V_{SG}$=0V. Under this condition, trapped electrons in the floating gate 802 are repelled out by FN tunneling, thereby adjusting the memory cell 800 to a lower threshold voltage (lower $V_{TH}$) state, for example, in a range like $V_{TH}$<−1V. When implementing a read operation, $V_{BL}$=0V, $V_{WL}$=0V, $V_{SL}$=1.5V, $V_{DPW}$=0V, and $V_{SG}$=5V.

Referring to FIG. 9(a) to FIG. 9(c), a segmental circuit arrangement of the 2T-BiNOR-EEPROM and exemplary operation modes thereof (erase, program, and read operations, respectively) are shown according to the fourth preferred embodiment of this invention. As shown in FIG. 9(a), during an erase operation, all of the word lines (only $WL_0$~$WL_3$ are shown) are applied with a word line voltage of 10V, and $V_{PDW}$=−8V. All of the bit lines (only $BL_1$ and $BL_2$ are shown) are floating. Source lines (SL) are applied with a source line voltage of 8V. A gate voltage of 6V is applied to the control gate of the source line selection transistor SG (only $SG_0$~$SG_3$ are shown). A gate voltage of 8V is applied to the control gate of the bit line selection transistor SGB. Under this condition, electrons are injected into the floating gates of all of the memory transistors through the FN tunneling mechanism so as to adjust the threshold voltage ($V_{TH}$) of each of the memory cells to a relatively high $V_{TH}$ state, preferably, in a range of 1.5V<$V_{TH}$<3.5V.

As shown in FIG. 9(b), during a data program operation, a word line voltage of 10V is applied to the control gate of a selected word line $WL_1$, by way of example. A word line voltage of 0V is applied to the non-selected word lines, i.e., $WL_0$, $WL_2$ and $WL_3$. $V_{PDW}$=0V. A bit line voltage of 5V is applied to a selected bit line $BL_1$. Non-selected bit lines (only one non-selected bit line $BL_2$ is shown) are grounded. The source line (SL) is kept in a floating status. A gate voltage of 7V is applied to the control gate of the bit line selection transistor SGB. A gate voltage of 0V is applied to the control gate of the source line selection transistor SG. Under this condition, electrons are repelled out of the floating gate of the selected memory transistor through the FN tunneling mechanism so as to adjust the threshold voltage ($V_{TH}$) of each of the memory cells to a relatively low $V_{TH}$ state, preferably, $V_{TH}$<−1V.

As shown in FIG. 9(c), during a data read operation, a word line voltage of 0V is applied to the control gate of a selected word line $WL_1$, by way of example. A gate voltage of 5V is applied to the control gate of a selection transistor connected to the selected memory transistor. A word line voltage of 0V is applied to those non-selected word lines, i.e., $WL_0$, $WL_2$, and $WL_3$ so as to conduct channels thereof. A gate voltage of 0V is applied to those nonselected selection transistors $SG_0$, $SG_2$, $SG_3$. A source line voltage ($V_{SL}$) of 1.5V is applied to the source lines (SL). The DPW is connected to ground ($V_{DPW}$=0V). A bit line voltage of 0V is applied to a selected bit line $BL_2$. A bit line voltage of 1.5V is applied to those non-selected bit lines (only one non-selected bit line ($BL_1$) is shown). A gate voltage of 5V is applied to the control gate of the bit line selection transistor SGB. It is one of the main features of the present invention that the source line is electrically coupled to the cell N well to avoid aforementioned large read current bounce or potential power crash. This is because, under the above-described read voltage conditions, a large capacitance is created at the junction between the cell N well (CNW) and the underlying deep P well (DPW). As specifically indicated in FIG. 9(c) and FIG. 15, the induced capacitor "$C_{CNW/DPW}$" formed between the CNW CNW/DPW and the DPW due to the formation of the depletion region therebetween is charged up during the read operation and therefore helps to stabilize source line voltage.

Figure 10:
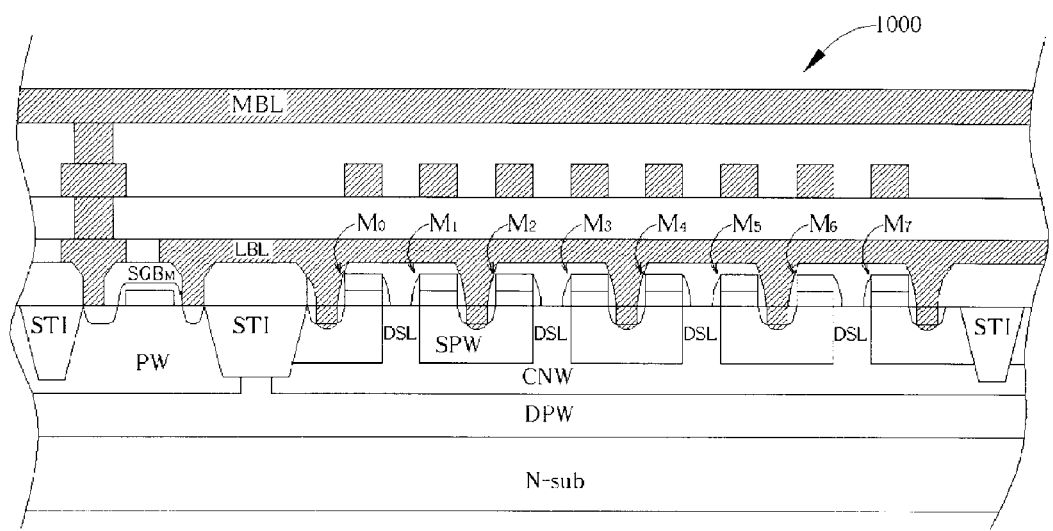
FIG. 10(*a*) and FIG. 10(*b*) are an EEPROM in a cross-sectional view and corresponding equivalent circuit according to the fifth preferred embodiment of the present invention.
Figure 10:
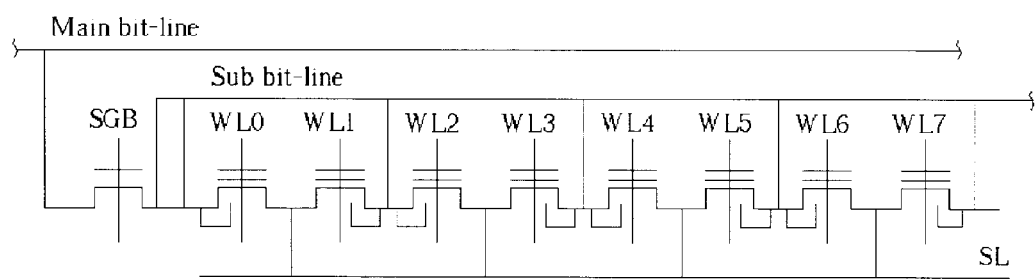
Figure 11:
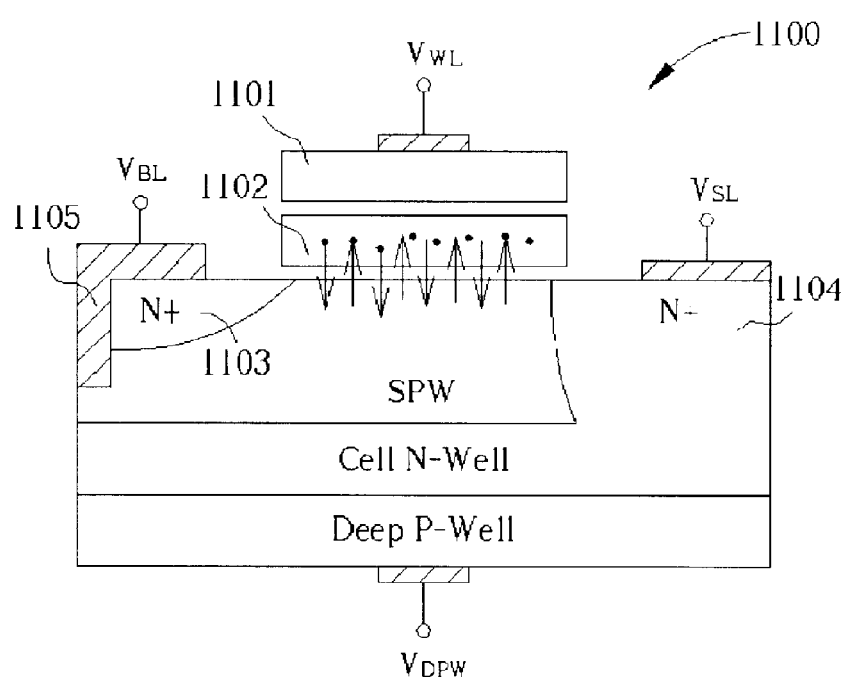
FIG. 11(*a*) and FIG. 11(*b*) are a cross-sectional schematic diagram illustrating a BiNOR EEPROM cell and exemplary operation modes thereof (erase, program, and read operations, respectively) according to the fifth preferred embodiment of this invention.
Figure 12:
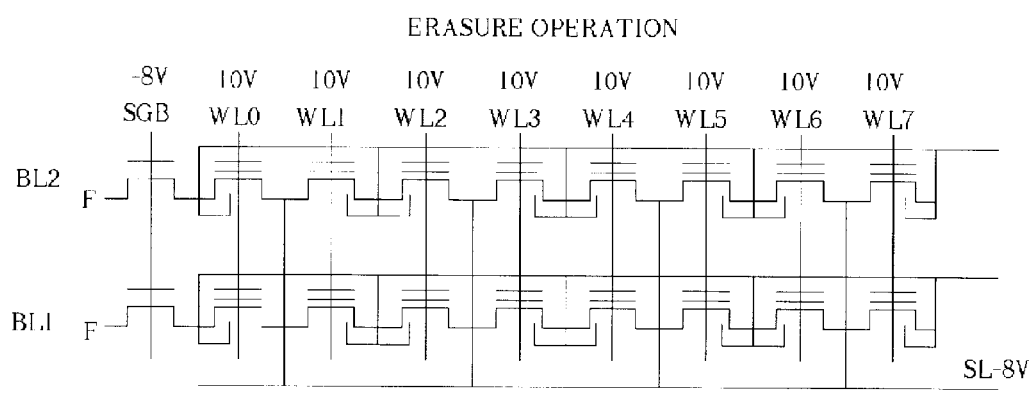
FIG. 12(*a*) to FIG. 12(*c*) are segmental circuit arrangement of the BiNOR EEPROM and exemplary operation modes thereof (erase, program, and read operations, respectively) according to the fifth preferred embodiment of this invention.
Figure 12:
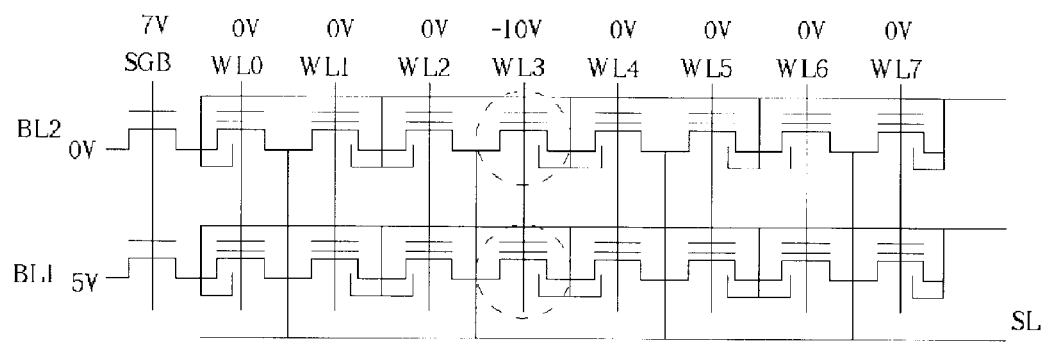
Figure 12:
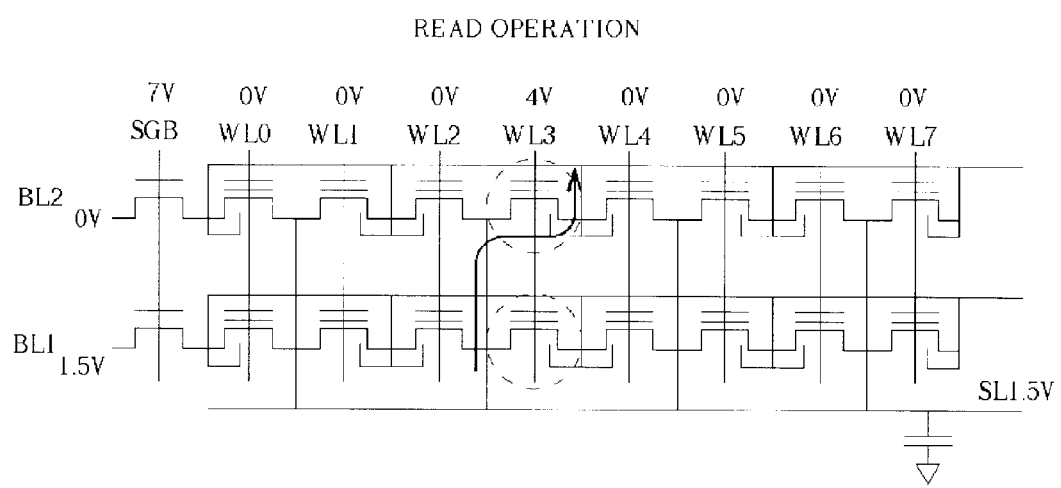

Referring to FIG. 10(a) and FIG. 10(b), an EEPROM 1000 in a cross-sectional view and corresponding equivalent circuit according to the fifth preferred embodiment of the present invention are illustrated. Compared to the fourth embodiment of this invention, the fifth preferred embodiment of this invention has no selection transistors (SG) formed on the SPW in the memory array. Consequently, it is particularly suited for high-density data flash memory. As shown in FIG. 10 (a), EEPROM 1000, which is based on a novel low-voltage bi-directional FN write/erase NOR type (BiNOR) flash memory array architecture, comprises a DPW formed on an N-substrate, a CNW formed on the DPW, columns of isolated SPW formed within the CNW, a plurality of memory cells ($M_0$~$M_7$) formed on the SPW, and a local bit line LBL overlying the memory cells ($M_0M_7$). Each memory cell ($M_0$~$M_7$) has a stacked gate structure, i.e., upper word lines ($WL_0$~$WL_7$) and floating gates. The source of each of the memory cells ($M_0M_7$) is an $N^+$ deep doping region (DSL) and is contiguous with the underlying CNW, thereby dividing the column of SPW into sub-wells. The drain of each of the memory cells ($M_0$~$M_7$) is penetrated by a contact plug, which extends downward to the SPW, thereby short-circuiting the drain and the SPW. As shown in FIG. 10(b), a main bit line selection transistor SGB is disposed between the main bit line and the local bit line and is used to control signals from the main bit line to the local bit line. With such configuration, the EEPROM 1000 of thi s invention is capable of implementing unique low-voltage and random access FN write/erase operations.

Referring to FIG. 11(a) to FIG. 11(c), a cross-sectional schematic diagram illustrating a BiNOR EEPROM cell 1100 and exemplary operation modes thereof (erase, program, and read operations, respectively) are shown according to the fifth preferred embodiment of this invention. As mentioned, the BINOR EEPROM unit 1100 is fabricated on an isolated column of SPW that serves as a buried bit line. The LBL is electrically connected to the SPW through a contact plug that penetrates the junction between the drain of the memory cell and the subjacent SPW. As shown in FIG. 11(a), in operation, a word line voltage $V_{WL}$ is applied to the control gate 1101 of the memory transistor 1100, a bit line voltage $V_{BL\ is\ applied\ to\ the\ N+}$ drain 1103. Since the SPW and the drain 1103 are short-circuited together by using a plug 1105, the voltage of the SPW and the voltage of the drain 1103 are the same. A source voltage $V_{SL}$ is applied to the $N^+$ source 1104 of the memory transistor 1100. The $N^+$ source 1104 is an $N^+$ deep doping region and is contiguous with the subjacent cell N-well. The floating gate 1102 of the memory transistor 1100 is kept in a floating status. A well voltage $V_{DPW}$ is applied to the deep P-well.

As shown in FIG. 11(b), during an erase operation, $V_{BL}$ is floating, $V_{WL}$=10V, $V_{SL}$=−8V, $V_{DPW}$=−8V. Under this condition, electrons are injected into and trapped in the floating gate 1102 by FN tunneling through an oxide layer between the floating gate 1102 and the SPW, thereby adjusting the memory cell 1100 to a higher threshold voltage (higher $V_{TH}$) state, for example, V TH>6V. When implementing a program operation, $V_{BL}$=5V, $V_{WL}$=−10V, $V_{SL}$ is floating, $V_{DPW}$=0V. Under this condition, trapped electrons in the floating gate 1102 are repelled out by FN tunneling, thereby adjusting the memory cell 1100 to a lower threshold voltage (lower $V_{TH}$) state, for example, in a range like 1V<$V_{TH}$<2V. When implementing a read operation, $V_{BL}$= 0V, $V_{WL}$=4V $V_{SL}$=1.5V, $V_{DPW}$=0V.

Referring to FIG. 12(a) to FIG. 12(c), a segmental circuit arrangement of the BiNOR EEPROM and exemplary operation modes thereof (erase, program, and read operations, respectively) are shown according to the fifth preferred embodiment of this invention. As shown in FIG. 12(a), during an erase operation, all of the word lines ($WL_0$~$WL_7$) are applied with a word line voltage of 10V, and $V_{PDW}$=−8V. All of the bit lines (only $BL_1$ and $BL_2$ are shown) are floating. Source lines (SL) are applied with a source line voltage of 8V. A gate voltage of 8V is applied to the control gate of the bit line selection transistor SGB. Under this condition, electrons are injected into the floating gates of all of the memory transistors through the FN tunneling mechanism so as to adjust the threshold voltage ($V_{TH}$) of each of the memory cells to a relatively high $V_{TH}$ state, preferably, $V_{TH}$>6V.

As shown in FIG. 12(b), during a data program operation, a word line voltage of 10V is applied to the control gate of a selected word line $WL_3$, by way of example. A word line voltage of 0V is applied to the non-selected word lines, i.e., $WL_0$~$WL_2$ and $WL_4$~$WL_7$. $V_{PDW}$=0V. A bit line voltage of 5V is applied to a selected bit line $BL_1$. Non-selected bit lines (only one non-selected bit line $BL_2$ is shown) are grounded. The source line (SL) is kept in a floating status. A gate voltage of 7V is applied to the control gate of the bit line selection transistor SGB. Under this condition, electrons are repelled out of the floating gate of the selected memory transistor through the FN tunneling mechanism so as to adjust the threshold voltage ($V_{TH}$) of each of the memory cells to a relatively low $V_{TH}$ state, preferably, 1V<$V_{TH}$<2V.

As shown in FIG. 12(c), during a data read operation, a word line voltage of 4V is applied to the control gate of a selected word line $WL_3$, by way of example. A word line voltage of 0V is applied to those non-selected word lines $WL_0$~$WL_2$ and $WL_4$~$WL_7$. A source line voltage of 1.5V is applied to the source lines (SL) that is electrically coupled to the CNW. The DPW is connected to ground ($V_{DPW}$=0V). A bit line voltage of 0V is applied to a selected bit line BL2 A bit line voltage of 1.5V is applied to those non-selected bit lines (only one non-selected bit line ($BL_1$) is shown). A gate voltage of 7V is applied to the control gate of the bit line selection transistor SGB. Likewise, a large capacitance is created at the junction between the cell N well (CNW) and the underlying deep P well (DPW) to avoid large read current bounce or potential power crash.

Figure 13:
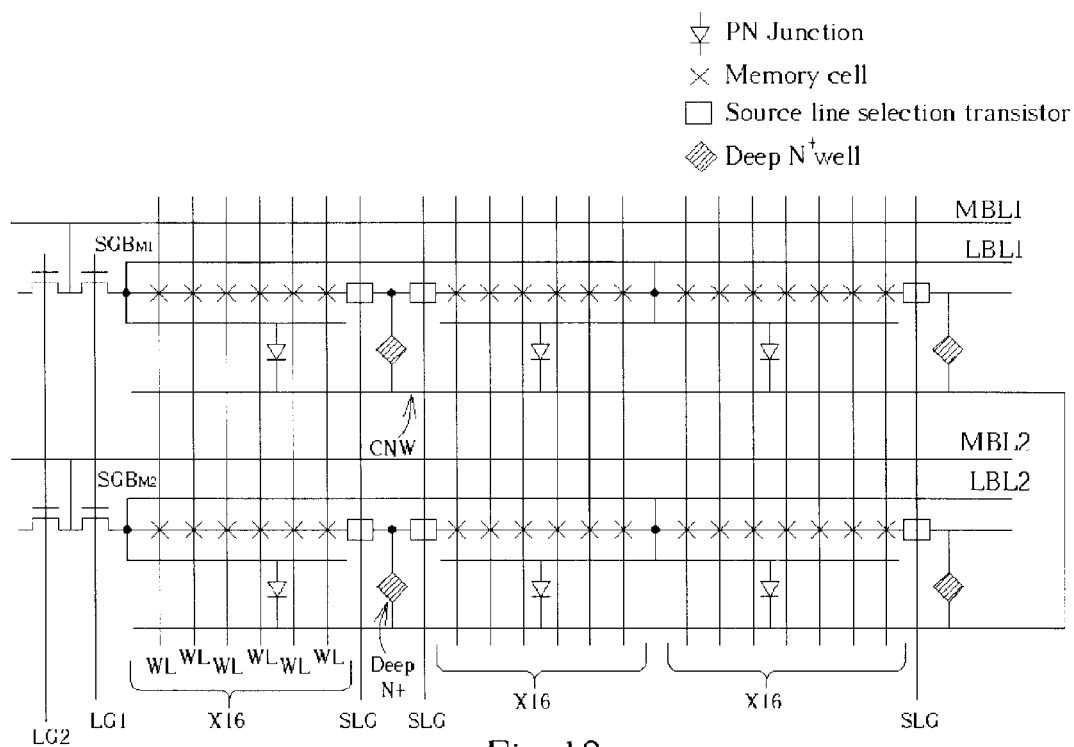
FIG. 13 and FIG. 14 illustrate other embodiments according to this invention.
Figure 14:
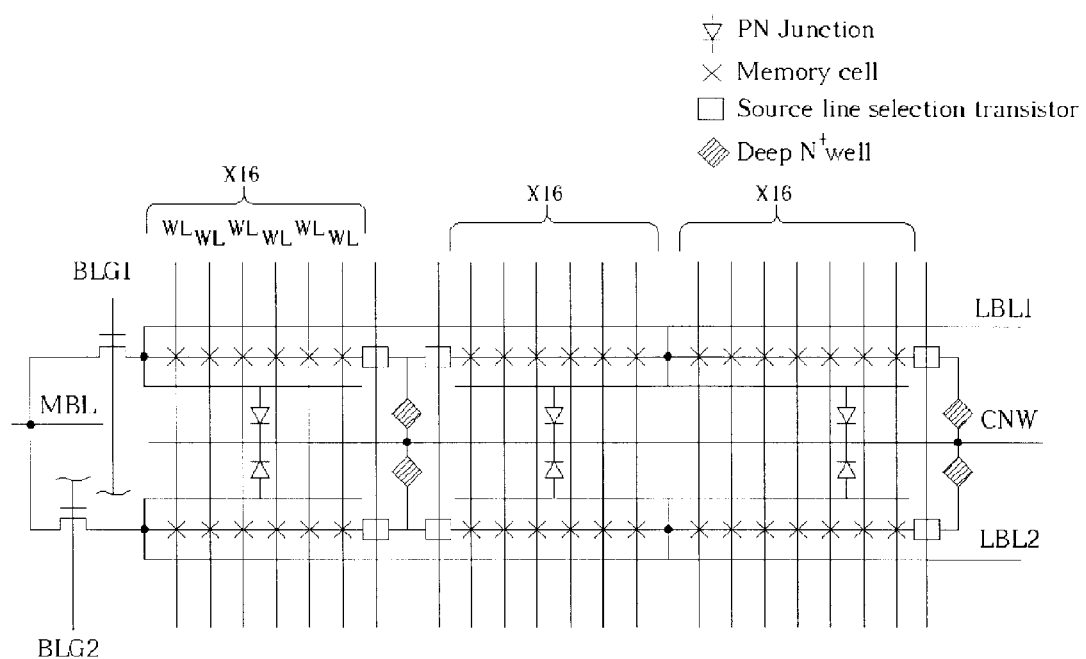
Figure 15:
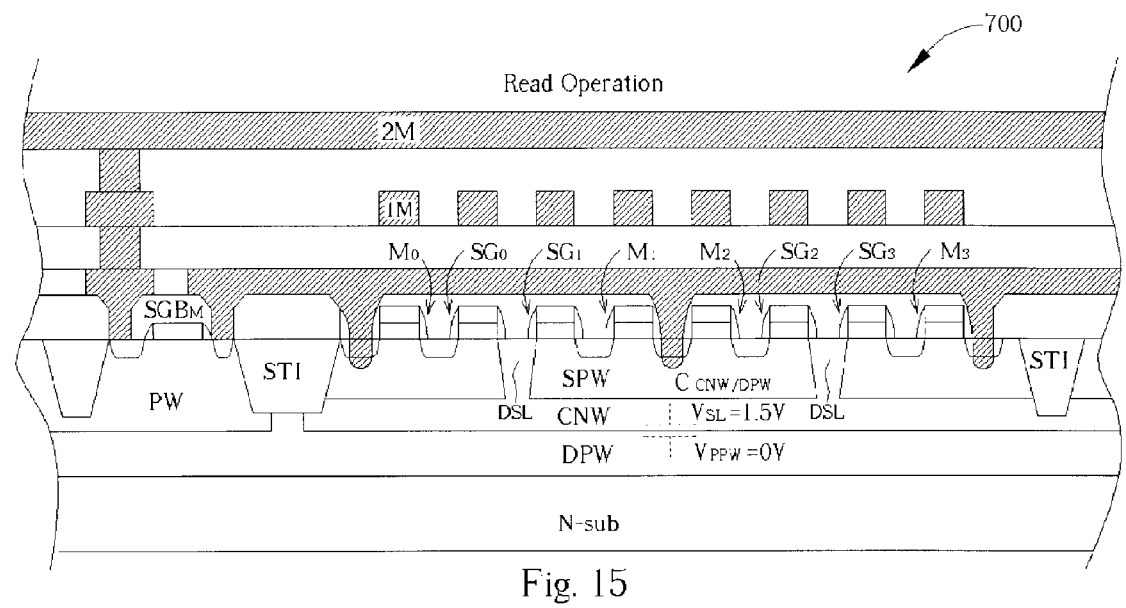
FIG. 15 is a schematic cross-sectional view showing a portion of an EEPROM according to the fourth preferred embodiment of this invention, wherein an induced capacitor between the CNW and the DPW during read operation is also illustrated with dash line.

Referring to FIG. 13 and FIG. 14, other embodiments according to this invention are shown. In FIG. 13, a one-MBL-to-one-LBL layout is illustrated. Bit line signals from the MBL1 to the LBL1 are controlled by a $SGB_{M1}$. Bit line signals from the MBL2 to the LBL2 are controlled by a SGB $_{M2}$. In FIG. 14, a one-MBL-to-two-LBL layout is illustrated.

Those skilled in the art will readily observe that numerous modification and alterations of the device may be made while retaining the teachings of the invention. Accordingly, the above disclosure should be construed as limited only by the metes and bounds of the appended claims.

What is claimed is:

1. An electrically erasable programmable read only memory (EERPOM) with source line voltage stabilization mechanism, comprising:

a semiconductor substrate of a first conductivity type having a memory region;

a deep ion well of a second conductivity type formed in said semiconductor substrate;

a cell ion well of said first conductivity type located within said memory region in said semiconductor substrate, said cell ion well being situated above said deep ion well;

a shallow ion well of said second conductivity type serving as a buried bit line doped within said cell ion well, said shallow ion well being isolated by an STI layer, wherein said STI layer has a thickness greater than a well depth of said shallow ion well;

at least one memory transistor comprising a stacked gate, a source, and a drain formed on said shallow ion well, wherein said source of said memory transistor is electrically coupled to said cell ion well to induce a capacitor between said cell ion well and said deep ion well during a read operation, thereby avoiding read current bounce or potential power crash; and a bit line overlying said memory transistor and electrically connected to said drain of said memory transistor via a bit line contact plug short-circuiting said drain of said memory transistor and said shallow ion well.

2. The EERPOM according to claim 1 wherein said first conductivity type is N type and said second conductivity type is P type.

3. The EERPOM according to claim 1 wherein said stacked gate of said memory transistor comprises a floating gate and a control gate stacked on said floating gate.

4. The EERPOM according to claim 3 wherein said control gate of said memory transistor is electrically connected to a word line.

5. The EERPOM according to claim 1 wherein during said read operation, a positive read voltage is applied on said source line, and said deep ion well is grounded.

6. An electrically erasable programmable read only memory (EERPOM) with source line voltage stabilization mechanism, comprising:

a semiconductor substrate of a first conductivity type having a memory region;

a deep ion well of a second conductivity typeformed in said semiconductor substrate;

a cell ion well of said first conductivity type located within said memory region in said semiconductor substrate, said cell ion well being situated above said deep ion well;

a shallow ion well of said second conductivity type serving as a buried bit line doped within said cell ion well, said shallow ion well being isolated by an STI layer, wherein said STI layer has a thickness greater than a well depth of said shallow ion well;

at least one memory transistor comprising a stacked gate, a source, and a drain formed on said shallow ion well;

a selection transistor formed on said shallow ion well, said selection transistor has a first terminal serially connected to said source of said memory transistor, said selection transistor comprising a select gate and a second terminal electrically coupled to a source line, wherein said source line is electrically coupled to said cell ion well to induce a capacitor between said cell ion well and said deep ion well during a read operation, thereby avoiding read current bounce or potential power crash; and a bit line overlying said memory transistor and electrically connected to said drain of said memory transistor via a bit line contact plug short-circuiting said drain of said memory transistor and said shallow ion well.

7. The EERPOM according to claim 6 wherein said first conductivity type is N type and said second conductivity type is P type.

8. The EERPOM according to claim 6 wherein said stacked gate of said memory transistor comprises a floating gate and a control gate stacked on said floating gate.

9. The EERPOM according to claim 8 wherein said control gate of said memory transistor is electrically connected to a word line.

10. The EERPOM according to claim 6 wherein during said read operation, a positive read voltage is applied on said source line, and said deep ion well is grounded.

11. An electrically erasable programmable read only memory (EERPOM) with source line voltage stabilization mechanism, comprising:

a semiconductor substrate of a first conductivity type having a memory region;

a deep ion well of a second conductivity type formed in said semiconductor substrate;

a cell ion well of said first conductivity type located within said memory region in said semiconductor substrate, said cell ion well being situated above said deep ion well;

a shallow ion well of said second conductivity type serving as a buried bit line doped within said cell ion well, said shallow ion well being isolated by an STI layer, wherein said STI layer has a thickness greater than a well depth of said shallow ion well;

at least one memory cell block comprising a plurality of serially connected memory cells formed on said shallow ion well;

a selection transistor formed on said shallow ion well at one end of said memory cell block, said selection transistor has a first terminal serially connected to said memory cell block, and said selection transistor comprising a select gate and a second terminal electrically coupled to a source line, wherein said source line is further electrically coupled to said cell ion well to induce a capacitor between said cell ion well and said deep ion well during a read operation, thereby avoiding read current bounce or potential power crash; and a bit line overlying said memory cell block and electrically connected to a drain of one of said plurality of serially connected memory cells at the other end of said memory cell block via a bit line contact plug short-circuiting said drain and said shallow ion well.

12. The EERPOM according to claim 11 wherein said first conductivity type is N type and said second conductivity type is P type.

13. The EERPOM according to claim 11 wherein each of said plurality of serially connected memory cells of said memory cell block comprises a floating gate and a control gate stacked on said floating gate.

14. The EERPOM according to claim 13 wherein said control gate of said memory transistor is electrically connected to a word line.

15. The EERPOM according to claim 11 wherein during said read operation, a positive read voltage is applied on said source line, and said deep ion well is grounded.

* * * * *

UNITED STATES PATENT AND TRADEMARK OFFICE
CERTIFICATE OF CORRECTION

PATENT NO.      : 6,888,190 B2                                    Page 1 of 1
APPLICATION NO. : 10/707080
DATED           : May 3, 2005
INVENTOR(S)     : Ching-Sung Yang et al.

It is certified that error appears in the above-identified patent and that said Letters Patent is hereby corrected as shown below:

On the Title page, Item (63) Related U.S. Application Date "now abandoned" should read -- Patent No. 6847087. --

Signed and Sealed this

Fourth Day of September, 2007

JON W. DUDAS
*Director of the United States Patent and Trademark Office*